United States Patent
Haji Mokhtar et al.

(10) Patent No.: US 12,015,382 B1
(45) Date of Patent: Jun. 18, 2024

(54) METHOD AND APPARATUS FOR A LINEARIZED RF AMPLIFIER CURRENT SOURCE

(71) Applicant: Scientific Components Corporation, Brooklyn, NY (US)

(72) Inventors: Fuad Haji Mokhtar, Kedah (MY); Norizwani Mohd Nazari, Perak (MY)

(73) Assignee: Scientific Components Corporation, Brooklyn, NY (US)

( * ) Notice: Subject to any disclaimer, the term of this patent is extended or adjusted under 35 U.S.C. 154(b) by 448 days.

(21) Appl. No.: 17/517,230

(22) Filed: Nov. 2, 2021

Related U.S. Application Data (60) Provisional application No. 63/109,963, filed on Nov. 5, 2020.

(51) Int. Cl.
*H03F 1/32* (2006.01)
*H03F 3/193* (2006.01)

(52) U.S. Cl.
CPC ........... *H03F 1/3205* (2013.01); *H03F 3/193* (2013.01)

(58) Field of Classification Search
CPC .......... H03F 1/3205; H03F 3/193; H03F 3/04; H03F 3/18
USPC .................................................. 330/285, 296
See application file for complete search history.

(56) References Cited

U.S. PATENT DOCUMENTS

| | | | | |
|---|---|---|---|---|
| 6,842,075 B2 * | 1/2005 | Johnson | ................. | G05F 3/265 |
| | | | | 330/296 |
| 7,839,217 B2 * | 11/2010 | Okuma | ................... | H03F 3/195 |
| | | | | 330/296 |

* cited by examiner

*Primary Examiner* — Hieu P Nguyen
(74) *Attorney, Agent, or Firm* — Lawrence G. Fridman, Esq; FEIGIN & FRIDMAN, LLC (57) ABSTRACT

An apparatus and method for a linearized RF and microwave amplifier current source by feedback of a sampled RF amplifier output signal into a current mirror amplifier bias, to modulate the amplifier bias and produce an increase in a linearized amplifier output. The linearized RF and microwave amplifier is operable over a large bandwidth extending over multiple microwave frequency octaves.

20 Claims, 7 Drawing Sheets

METHOD AND APPARATUS FOR A LINEARIZED RF AMPLIFIER CURRENT SOURCE

CROSS-REFERENCE TO RELATED APPLICATIONS

This application claims priority of U.S. Provisional Application Ser. No. 63/109,963 filed Nov. 5, 2020, the entire disclosure of which is hereby incorporated by reference.

FIELD OF THE INVENTION

The present invention relates generally to electronic devices, and in particular to radio frequency (RF) amplifier devices.

BACKGROUND OF THE INVENTION

Radio frequency (RF) signal energy may be amplified in magnitude by use of an amplifier. Such signal amplification may produce a linear signal gain from an amplifier input to an amplifier output. Such signal amplification may additionally produce output power non-linearly related to an input signal, where such non-linearities may be a result of semiconductor devices used by an amplifier and may be a result of supply power circuits, e.g., bias circuits, that may be used to supply source power to an amplifier. As output signal non-linearities increase, e.g., in non-linearity signal magnitude, non-linearity signal power, a reduced amount of signal power may be available for a linear output signal component.

There remains a need for a device and method, e.g., a circuit and/or technique, to supply source power to an amplifier that may reduce non-linear signal output components thus making an increased amount of output power available for a linear amplifier output signal component and/or reduce generation of inter-modulation signal products that may be undesired.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Embodiments of the invention are illustrated by way of example and not limitation in the figures of the accompanying drawings, in which like reference numerals indicate corresponding, analogous or similar elements. It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF EMBODIMENTS OF THE PRESENT INVENTION

In the following detailed description, numerous specific details are set forth in order to provide a thorough understanding of the invention. However, it will be understood by those skilled in the art that the invention may be practiced without these specific details. In other instances, well-known methods, procedures, and components have not been described in detail so as not to obscure the invention.

According to embodiments of the invention, a radio frequency (RF) amplifier, e.g., an RF transistor and/or a microwave transistor, may be powered and/or be biased by a current mirror circuit. An amplifier may output a desired amplified signal and may also output RF distortion. A sample of such amplified signal and/or such distortion may be fed back into a current mirror circuit. An additional feedback circuit, for example, connected from an output of an amplifier transistor to a current mirror, e.g., a resistor and a capacitor connected together series, may be added to feed back a selection of such distortion, for example, by selection of an amount of distortion, by selection of one or more frequencies of a distortion signal, e.g., a distortion at a frequency that may be different from a desired amplified signal, etc. An amount of signal, e.g., a fed back signal, may be selected, for example, by adjusting a value of one or more of feedback component values, e.g., resistor values, capacitor values, etc. A bypass circuit may be connected from a current mirror to ground, and may be adjusted to select an amount of feedback signal, for example an amplified signal and/or a distortion signal, that may be terminated to ground and, for example, removed from a feedback loop path. Such a bypass circuit may, for example, be a capacitor and a resistor in series, or the like. A feed circuit, e.g., a resistor, may be connected from a current mirror to an input of an amplifier circuit, e.g., a gate input, for example, to provide bias to an amplifier. Distortion that may be selected may be returned to an amplifier by such a feed circuit and/or resistor, and may be in a form, for example in an anti-polar phase, 180 degrees out of phase with an amplified signal, e.g., that may cause destructive interference, and may reduce and/or eliminate an amount of distortion of an amplifier output. Selection of components, e.g., component values, may provide for selection of amounts of signal delivered by networks comprised of such components.

According to embodiments of the invention, a radio frequency (RF) amplifier, e.g., an RF transistor, may be powered and/or be biased by two or more transistors, e.g., field effect transistors (FET), that may be arranged into a current mirror circuit. Such a current mirror may have a bias resistor that may be connected between a current mirror and an amplifier transistor, e.g., a field effect transistor (FET), and there may be a capacitor connected from such a bias resistor to ground, for example that may be used to provide a bypass path to ground for any RF signals that may be travelling, e.g., leaking, from an amplifier through a feedback path connection. Such a feedback path connection may be through a bias resistor. An amplifier may be one or more transistors, or other semiconductor devices that may provide for RF and/or microwave signal amplification. A bias circuit may be any two or more transistors that perform at least a function of a current mirror and/or an analogous function, and may perform other functions as well. Other bias and/or amplifier power supply circuits may be possible.

An RF amplifier may output distortion, for example in addition to a desired amplified signal. Such distortion my be fed back through bias resistors and/or other bias components, for example into a current mirror circuit, and the amount of fed back distortion may be controlled by adjustment of component values. Such distortion may modulate a bias supply, and may be adjusted such that when such bias supply may be modulated it may reduce and/or cancel some distortion of an RF amplifier that may be supplied by such bias. Such feedback circuit may be a loop, for example a closed loop circuit.

An embodiment of the invention may be an apparatus and/or a method for a linearized RF amplifier current source that may be by feedback of a sampled RF amplifier output signal into a current mirror amplifier bias circuit, that may produce, for example, an increase in a linearized amplifier output, and may be operable, for example, over a large bandwidth that may extend over multiple microwave frequency octaves. A device indicated as operating in an RF frequency range, or band, may be similarly operating herein in a microwave frequency range, or band, without further indication.

According to embodiments of the invention, signal radio frequency (RF) amplifiers may have a nonlinearity behavior that may be inherent within a nonlinear characteristic of a semiconductor fabrication process. A linearity behavior may be considered as to be divided into two or more categories. For example, a category may be small signal linearity, e.g., small signal intermodulation distortion may be measured by an output third order intermodulation (OIP3) parameter. A category may be large signal linearity, e.g., large signal modulation distortion that may be measured, for example by Adjacent Channel Leakage Ratio (ACLR), Error Vector Magnitude (EVM), or another suitable parameter or combination of parameters. An embodiment of the invention may provide for improvement to at least small signal linearity and large signal linearity, for example, of an amplifier.

According to embodiments of the invention, an amplifier, for example an integrated amplifier, e.g., a low noise amplifier (LNA), a power amplifier (PA), or other amplifier, may be powered by a bias circuit, and may be referred to as biased. A bias circuit may include a current supply circuit, e.g. a current mirror, and may have a first transistor, e.g. Q bias 1, and may have a second transistor, e.g., Q bias2. A first transistor and a second transistor may be electrically operably connected in a predetermined configuration, e.g. a current mirror. Such transistors may be field effect transistors (FET). A second transistor may operate as a mirror current FET. A resistor, e.g., R, may be electrically operable connected to both a first transistor and a second transistor, and may be connected to a source connection of each transistor. R may be used to determine an amount of bias, e.g., source current that may be available for use by an RF amplifier semiconductor. Such bias may be used to set a current, e.g., a quiescent current. A capacitor, e.g., C, may be electrically operable connected to a first transistor. A capacitor may be connected from a first transistor source and a circuit ground, and may be connected, for example, in a bypass configuration. A capacitor may be used to bypass radio frequency (RF) signals that, for example, may be leaking from an output to a circuit ground. A capacitor may be used to bypass an RF output signal that may be passing through a resistor, and a current mirror operation may be corrupted if such capacitor is omitted or not functioning properly. Electrical signals may be power signals, voltage signals, current signals, etc.

A current mirror may be an electrical circuit designed and/or constructed to use direct current (DC) power that may be externally supplied, to supply power, for example, in the form of supply current, to an RF device or circuit, e.g., an RF amplifier. An RF circuit may operate with an improved performance, e.g., an RF amplifier may operate with an improvement in gain, a reduction in output of undesired harmonic electrical signal content, a reduction of non-linear electrical augmentation of an input signal to an output signal, etc., when powered by a current mirror circuit designed and/or constructed for such purpose. Such a current mirror may provide supply current to an RF amplifier according to the needed power requirements of such an RF amplifier, which may be constant or may change according to one or more parameters, for example, applied input RF signal power, a change in environmental conditions, e.g., ambient temperature, or other parameters. An output impedance, e.g., a Thevenin equivalent impedance, may be controlled by selection of values and electrical connection of passive components, e.g., resistors, capacitors, inductors, etc., as part of a current mirror circuit. Electrical power, e.g., drive current, may be supplied from a current mirror circuit to an RF circuit, e.g., an RF amplifier. A current mirror may provide a change in supply power according to changes in operation of an RF amplifier. A current mirror may supply DC power, power at one or more other frequencies, e.g., at harmonically related frequencies, at frequencies that may be predetermined according to linear and/or non-linear properties of an RF amplifier, or other frequencies.

A current mirror may be designed and/or constructed using two or more transistors. In some embodiments, a current mirror may be designed and/or constructed using one or more transistors, for example, a bias circuit may be operable with a single FET current mirror, and may operate without a buffering amplifier, e.g., a without a second FET. Transistors may be field effect transistors (FET), bipolar junction transistors (BJT), heterojunction bipolar transistors (HBT), metal oxide semiconductor (MOS) transistors and/or other transistors. Transistors may be n-type and/or p-type. MOS transistors may be enhancement type and/or depletion type. Transistors may be a type of semiconductor and may have, for example, an exponential characteristic operating function. Other devices that may have an exponential characteristic operating function may also be used. Transistors may be monolithic and/or may be discrete elements, or discrete components and/or may be an integrated circuit (IC), or any combination thereof. A current mirror may be constructed as part of a monolithic microwave integrated circuit (MMIC) and/or be constructed to be electrically connected to and/or operate with a MMIC, e.g., an RF MMIC.

Embodiments of the invention may include a current mirror, and such current mirror may have any of a variety of topologies. An output power, e.g., current, drive of a transistor may depend on at least one other transistor and its operating condition, that may be predetermined, and may be electrically connected, or electrically operably connected to a drive transistor. Any suitable topology of a current mirror may be used. A current mirror may be used as a bias drive and/or power circuit, an active load circuit, or both.

An embodiment of the invention may introduce a capacitor, e.g., C injector, a resistor, e.g., R injector, another resistor, e.g., R balance injector and another capacitor, e.g., C bypass, which may function, for example together, to sample and inject an amount of sampled RF output signal that may be used to modulate a current mirror transistor. Such modulation may create a nonlinear signal that may be sufficient to compensate and/or, for example, cancel out, an effect, e.g., a nonlinearity effect, of a bias drive transistor, e.g., a Q LNA FET.

In some embodiments there may be feedback of an RF signal to a current minor, for example, through an R bias. An amount of an RF signal that may go into a current mirror may be controlled by, for example, a value of an R bias that may be used to set a quiescent current. Such an RF signal that may go into a current mirror may be bypassed, for example, by a C bypass, and may avoid a desensitization.

In some embodiments, an amount of an RF signal feedback to a current mirror, e.g., FETs used in a current mirror, may no longer be controlled by an R bias, and it may be adjusted independently, for example, by changing a value of one or more components that may be introduced, for example, additionally to a current mirror. Reducing of a value of an R injector resistance and/or increasing a value of a C injector capacitance, an additional amount of RF output signal may enter current mirror FETs. By reducing a value of an R balance injector resistance and/or increasing a value of a C bypass capacitance to ground, less RF output signal may enter current mirror FETs. Adjustments of values may be by either increasing one or more values, decreasing one or more values, or a combination thereof. A real impedance element, e.g., a resistor, a reactive impedance element, e.g., a capacitor, or other components, may represent one or more of each such type of component, or may represent a combinatory network of one or more such elements. A network of such elements may be represented as an equivalent circuit, e.g., a Thevenin and/or a Norton equivalent circuit. A real impedance element may represent, for example, a real impedance part of an equivalent circuit, and/or a reactive impedance element may represent, for example, a reactive impedance part of an equivalent circuit.

In some embodiments, a C injector and/or a C bypass value may be used to provide an adjustment to RF signal feedback, for example a frequency response, e.g., a magnitude and/or phase variation as a function of instantaneous frequency, to a bias circuit, e.g., a current mirror. An RF feedback signal may be, for example, modulated by a nonlinearity property of current mirror FETs. An amount, e.g., a percentage, of a nonlinearity, e.g., a distortion, property of a signal that may come out from current mirror FETs may depend on a strength of an RF feedback signal that may get into current mirror FETs and/or a size of a current mirror FET, e.g., a gate width of such FETs. An amount of a distorted signal from a current mirror may be injected into an input of a Q LNA and may be controlled by an R gate resistance. An optimum percentage of distortion and/or amplitude of a signal that may come out from a current mirror may be determined and may be used to cancel out one or more nonlinearity effects of a Q LNA, and such configuration may be in a negative feedback configuration. An optimum configuration may be where sufficient distortion and/or amplitude may be used for compensation, and without too much distortion and/or amplitude so as to overcompensate a Q LNA. Such overcompensation may result in a degradation of linearity, and may contribute to unnecessary compressed gain performance.

In some exemplary embodiments, values of one or more components, e.g., for optimization, may be optimized manually, or may be optimized by an automated process, a computer assisted process, an optimization program, or any combination thereof. Data may be presented in tabular form, graphical form, or any other convenient form for understanding. Some graph data presented herein may be an example and may be generated from a simulated circuit, for example that may have been optimized by a computer analysis program, e.g., Advanced Development System (ADS) by Keysight Technologies. In such an exemplary presentation, a 400 MHz-8 GHz half watt gain block example, may have an amount of feedback signal that may be going into current mirror FETs that may be relatively small, with respect to, for example, an amplifier output signal power, and may have a C injector capacitor value of less than 0.1 picofarads (pF). Such an exemplary embodiment may have an improvement in linearity performance attributable to inclusion of such capacitor, and gain compression may be, for example, less than 0.2 decibels (dB) to 0.5 dB.

In other exemplary embodiments, a circuit may be established, for example, with predetermined component values, a condition where an R injector and/or a C injector may not be needed, and where an R bias, an R balance injector and/or a C bypass may be sufficient to provide control of an RF feedback signal into a current mirror, and may create a same and/or substantially similar effect. Any combination of such components may be used.

Embodiments of the invention may work over a very wide frequency band, e.g., an RF signal operable range of frequencies. A digital predistortion (DPD) technique may be used, and such DPD may provide optimization over a reduced frequency band, for example, a mixer operable over a wide frequency band may be challenged to simultaneously achieve relatively high linearity over such wide frequency band. Embodiments of the invention may use a fully analog implementation and thus may be free from reliance on mixer and/or dynamic range limitations.

An RF amplifier circuit may be constructed by a variety of methods and by utilizing a selection of several materials, all with properties that may work well with RF signals. Such signals may be in the microwave frequency range, e.g. 300 MHz to 300 GHz, and/or other higher frequencies, lower frequencies and/or any combination of such frequencies, and may be in a range extending from zero hertz, e.g. direct current (DC), through microwave frequencies. Such materials may be selected such that an RF amplifier may be constructed in a monolithic microwave integrated circuit (MMIC) arrangement, topology and/or device. The construction of such devices in a MMIC arrangement may not be limiting of its performance to only one or more microwave frequency ranges, but rather may serve to define materials used in a physical construction. Embodiments of the invention may use MMIC devices for frequency ranges other than and/or including microwave frequencies. An Rf amplifier may refer to an amplifier operating in an RF frequency band, a microwave frequency band, another frequency band, or a combination of such bands.

Figure 1:
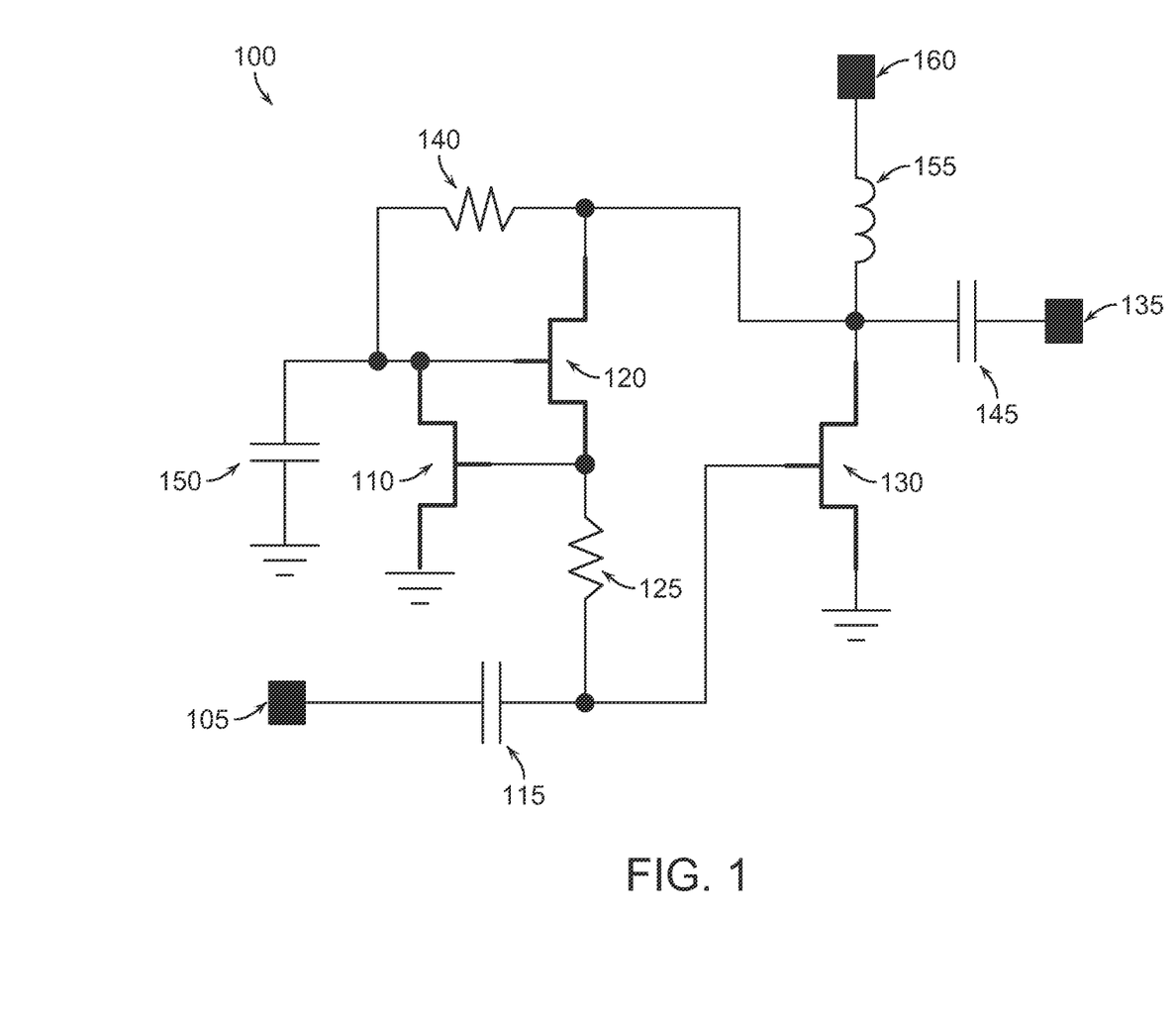
FIG. 1 depicts an exemplary diagram according to embodiments of the present invention.

FIG. 1 depicts an exemplary embodiment 100 of a current mirror electrically connected to an RF amplifier 130. A first transistor 110 may be a transistor, e.g., a bias transistor and/or a bias set transistor, and may be connected to a second transistor 120, where connections among such first and second transistors may be configured to be a current mirror circuit topology, or any topology having a function of a current mirror, or substantially similar to a current mirror, and may supply a bias current and/or a bias power to an RF and/or microwave amplifier. Resistor 140 may be a real impedance, may be part of a bias circuit of a current mirror, and may operably determine an operating current and/or transistor operating points of a bias circuit, e.g., a current mirror and/or contribute to stability of a circuit. Resistor 140 may be connected to both transistor 110 and transistor 120. Resistor 140 may be used to set a current, e.g., a quiescent current. A capacitor 150 may be a reactive impedance, may be part of a bias circuit of a current mirror and may operably provide a conduction path for undesired high and/or higher frequency electrical signals to terminate to ground, e.g., electrical signal ground, circuit ground, etc. Capacitor 150 may contribute to a stability of a circuit. Other bias components may be included in a bias circuit, e.g., a current mirror. Resistor 125 may be connected from transistor 120 to a gate connection of an RF amplifier transistor 130, and may be used to determine a voltage signal applied to such a gate connection. An RF signal may be input, e.g., from an input port 105, through a coupling capacitor 115. An RF signal, e.g., an amplified signal, may be output, e.g., from an output port 135, through a coupling capacitor 145. Direct current (DC) may supply power from a supply input port 160, and supply current may be delivered through inductor 155, or similar low pass devices and/or circuits. Some components, e.g., input and/or output coupling capacitors, 115 and 145, respectively, inductor components 155, and/or other RF circuit components and/or RF circuit bias diplexer components may additionally be connected at their respective operational connection attachment points. A current mirror bias circuit including transistors 110, 120 may supply drive current to an RF amplifier 130.

Figure 2:
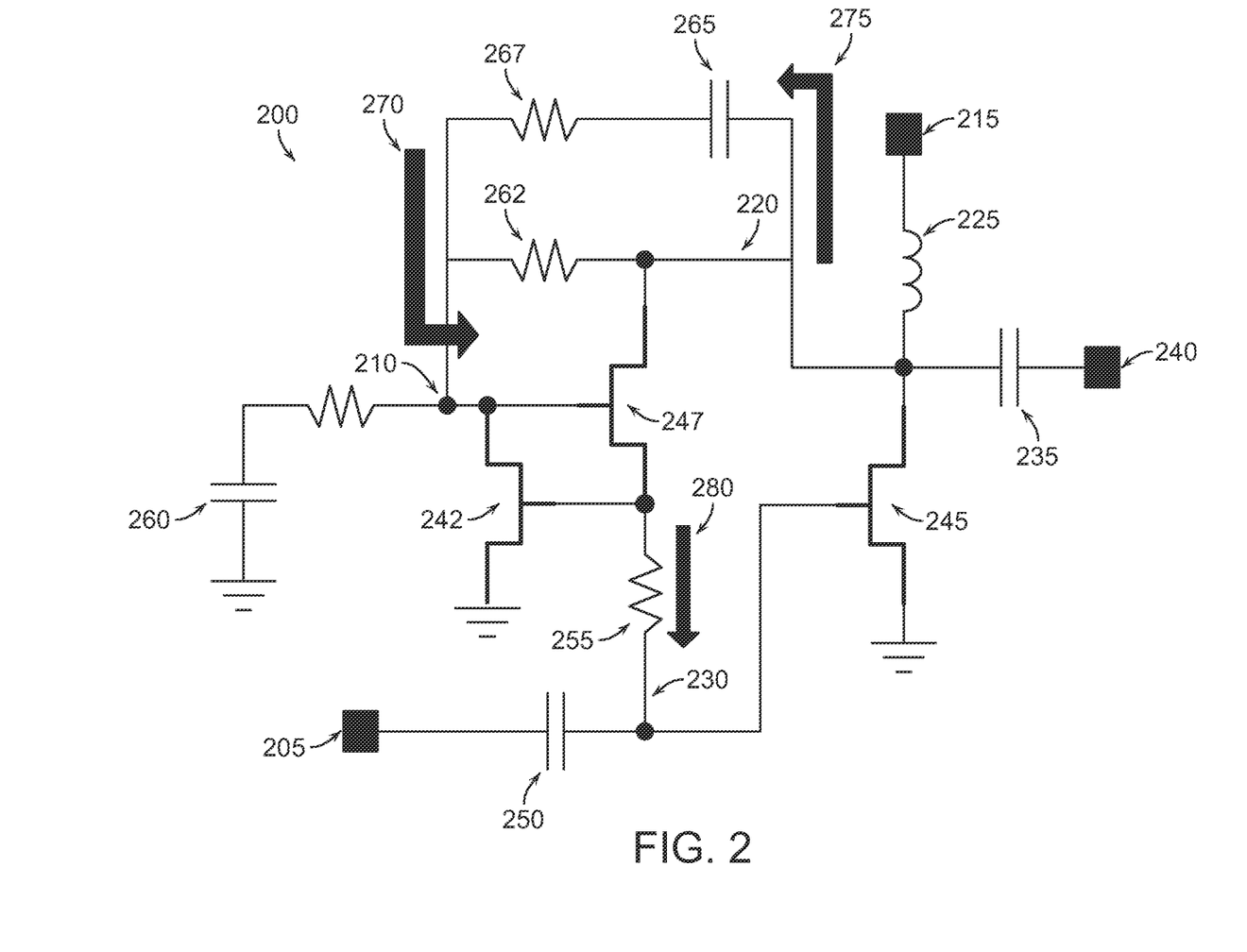
FIG. 2 depicts an exemplary diagram according to embodiments of the present invention.

FIG. 2 depicts an exemplary embodiment 200 of a current mirror electrically connected to an RF amplifier 245, for example an RF amplifier transistor, e.g., an FET, or an RF amplifier circuit comprising two or more transistors. A first transistor 242 may be connected to a second transistor 247, where connections among transistors may be configured to be a bias supply circuit, for example a current mirror circuit topology, or any topology having a function of a current mirror, or substantially similar to a current mirror. Resistor 262 may be a real impedance, may be part of a bias circuit of a current mirror, and may operably contribute to determining an operating current and/or transistor operating points of a bias circuit, e.g., a current mirror and/or contribute to stability of a circuit. Such a resistor may be connected to both transistor 242 and transistor 247. Resistor 262 may be used to set a current, e.g., a quiescent current. A capacitor 260 may be a reactive impedance, may be part of a bias circuit of a current mirror and may operably provide a conduction path for undesired higher frequency electrical signals to terminate to ground. A resistor may be referred to as a balance injector resistor, may be connected between capacitor 260 and circuit junction 210, may be connected in series with capacitor 260, and may be connected between 242 and 260.

A circuit network may include a resistive impedance 267 and a reactive impedance 265, that may be connected together in series, may be connected between a bias output drive 220 to an RF transistor 245, e.g., a low noise amplifier (LNA), and be connected to both transistor 242 and transistor 247. Capacitor 265, resistor 267, balance injector resistor and capacitor 260 may operate together to operably sample an RF amplified output signal, e.g., via feedback path 275, and may use such sampled signal to modulate a current mirror circuit 270, e.g., a modulation. Such modulation may create a non-linearity, for example a nonlinear operation and/or a nonlinear signal, e.g. a modulated nonlinear signal. Values of capacitor 265, resistor 267, resistor R balance injector and capacitor 260 may be selected to determine an amount of RF signal to be sampled and/or an amount of modulation that may be applied to a current mirror circuit. An amount and/or type, e.g., phase, etc., of a modulation may be selected to operably provide a cancellation of some or all of non-linearities that may be present in an RF amplifier as a result of its amplification and/or amplification process. Achievement of sufficient cancellation of RF amplifier non-linearities may be accomplished by adjusting values of one or more of capacitor 265, resistor 267, resistor R balance injector and capacitor 260, in addition to resistor 262. Such cancellation effects may be operable without impact and/or significant impact to an operation of a current mirror. Such cancellation effects may be operable by availability of a plurality of components, e.g., capacitor 265, resistor 267, resistor R balance injector, capacitor 260 and/or resistor 262, each having a value that may be set and/or predetermined, and such value may be based, for example, on non-linearities of an RF amplifier to which an associated bias circuit may be connected.

Transistor 242, transistor 247, resistor R balance injector, resistor 262 and resistor 267 may be electrically connected at a common connection point 210, e.g., a node, a connection node, an electrical circuit node, etc. Transistor 247, resistor 262 and capacitor 265 may be electrically connected at a common connection node 220, where such common node 220 may be connected to an RF amplifier 245, e.g., an RF amplifier transistor, a network of RF amplifier transistors, an RF monolithic microwave integrated circuit (MMIC) amplifier circuit, or any combination thereof. A drive current, a bias current and/or a power supply drive signal may be provided from a current mirror to an RF amplifier via common connection node 220.

A sample of an RF amplifier output electrical RF signal may be taken 275, e.g., measured, quantified, sampled, selected or otherwise determined, and may be conducted from an RF amplifier output through common connection node 220 into a feedback network. Such a feedback network may be capacitor 265 in series with resistor 267 and/or capacitor 265 in series with resistor 267, such series connection in parallel with resistor 262, or any other electrical network combination of such components. A sampled RF amplifier 245 output signal may be modified by a combination of real and/or reactive impedances of such feedback network, where modification may include changes to an amplitude, a phase, a harmonic content, or other parameters, and a magnitude of such modification may be according to values selected for each feedback component. Components within a feedback network may be interchangeable with respect to connection position, and may represent an equivalent circuit of one or more physical components.

A feedback network may send, e.g., inject, superimpose, combine, etc., a modified and/or sampled RF amplifier output signal into a current mirror 270 at common connection node 210, for example into two or more transistors, e.g., transistor 242, transistor 247, of a current mirror circuit, by, for example, combining with a current mirror bias, power supply and/or active electrical signal. Such an injected signal may modulate a current mirror, e.g., an electrical signal included in an operable signal of a current mirror, and such modulation may produce one or more non-linear electrical signal functions, modulations and/or responses. An output of a current mirror may be a modulation signal, an electrical current supply signal, a combination of a modulated signal and an electrical current supply signal and/or a combination of such signals with other higher order signals. Such a combination may be a modulation of one or more signals, a superposition of one or more signals, or other combinations of signals. A modulated signal may be modified so it may be an inverse, e.g., an inverse signal, an inverse of one or more signal components, an inverse of orders above a first order of a signal, etc., of a sampled RF amplifier output signal. Such a modulated signal may be introduced 280 back into an amplifier 245 via an amplifier's input. A combination of such a modulated signal with an RF amplifier output signal may produce at least cancellation of one or more signal orders above a first order. For example, combination of a modified feedback signal modulated by a current mirror with an RF amplifier output signal may suppress, cancel and/or substantially cancel a second and/or higher order non-linearity of such an RF amplifier output signal. Such combination may have an effect on second and/or higher order signal components and may have minimal or no effect on a fundamental, e.g., a desired, amplified signal output.

A modified feedback signal that may be modified by modulation of a current mirror may be applied to an input of an RF amplifier 280 at a common connection node 230. A resistor 255 may be connected between a current mirror and an RF amplifier input 230, e.g. a gate input. Such a resistor 255 may send, e.g., introduce, add, apply, combine, etc., a modulated and/or modified feedback signal with an RF amplifier input signal, and such a combined signal may be applied to an input of an RF amplifier. By applying inverse higher order signal components to an input of an RF amplifier with an RF input signal, distortion created by an RF amplifier may be cancelled and/or reduced. An RF amplifier may amplify an RF input signal and in doing so may produce non-linear signal components. An inverse of such components may be injected into such an RF amplifier, e.g., via feedback, such that they combine with the internally generated non-linear signal components to produce a linearized, e.g., combined, RF amplifier output that may include an amplified fundamental RF signal, and one or more non-linear signal components that each may have been reduced in magnitude by combination with applied inverse distortions. By only injecting higher order inverse non-linearities, a fundamental signal may not be affected and/or significantly affected and/or distorted, and an increase in linear amplified power at such fundamental signal may be realized.

A resistor R balance injector may be connected between a common connection node 210 and a capacitor 260. A capacitor 260 may be connected between a resistor R balance injector and ground, e.g., signal ground, circuit ground, etc. A series connection of R balance injector and bypass capacitor 260 may send a predetermined magnitude of a feedback signal to ground, e.g., for termination and/or removal from circuit operation. Values of R balance injector resistor 267 and capacitor 260 bypass may be determined to allow an amount of feedback signal to be terminated. Adjustment of such values may control a magnitude of modulation, and accordingly a magnitude of inverse distortion signal components, that may be injected into an input of an RF amplifier 280. An optimum amount, e.g., magnitude, of a feedback signal may be determined, and may be different for different RF amplifiers, RF amplifier operating points, RF amplifier dynamic ranges, or other circuit and/or topological variations.

Such a non-linear signal compensation, cancellation and/or reduction may be analog in nature and may operate on a continuous time basis. Such a compensation may be free from errors due to digital sampling, digital quantization and/or digital delay, e.g., digital feedback and/or processing delay. Such compensation may have an unrestricted, or at least a very great, dynamic range since there may be no reliance on any mixers, converters, e.g., analog-to-digital converters, etc. Such compensation may operate throughout and over a large instantaneous frequency bandwidth since there may be no reliance on any mixers, converters, e.g., analog-to-digital converters, etc.

Other components, for example RF coupling capacitors C1, C2 may be included in a circuit according to a design and/or construction of such a circuit. An RF signal may be input, e.g., from an input port 205, through a coupling capacitor 250. An RF signal, e.g., an amplified signal, may be output, e.g., from an output port 240, through a coupling capacitor 235. Direct current (DC) may supply power from a supply input port 215, and supply current may be delivered through inductor 225, or similar low pass devices and/or circuits. Some components, e.g., input and/or output coupling capacitors, 250 and 235, respectively, inductor components 225, and/or other RF circuit components and/or RF circuit bias diplexer components may additionally be connected at their respective operational connection attachment points. A current mirror bias circuit including transistors 242, 247 may supply drive current to an RF amplifier 245.

Figure 3:
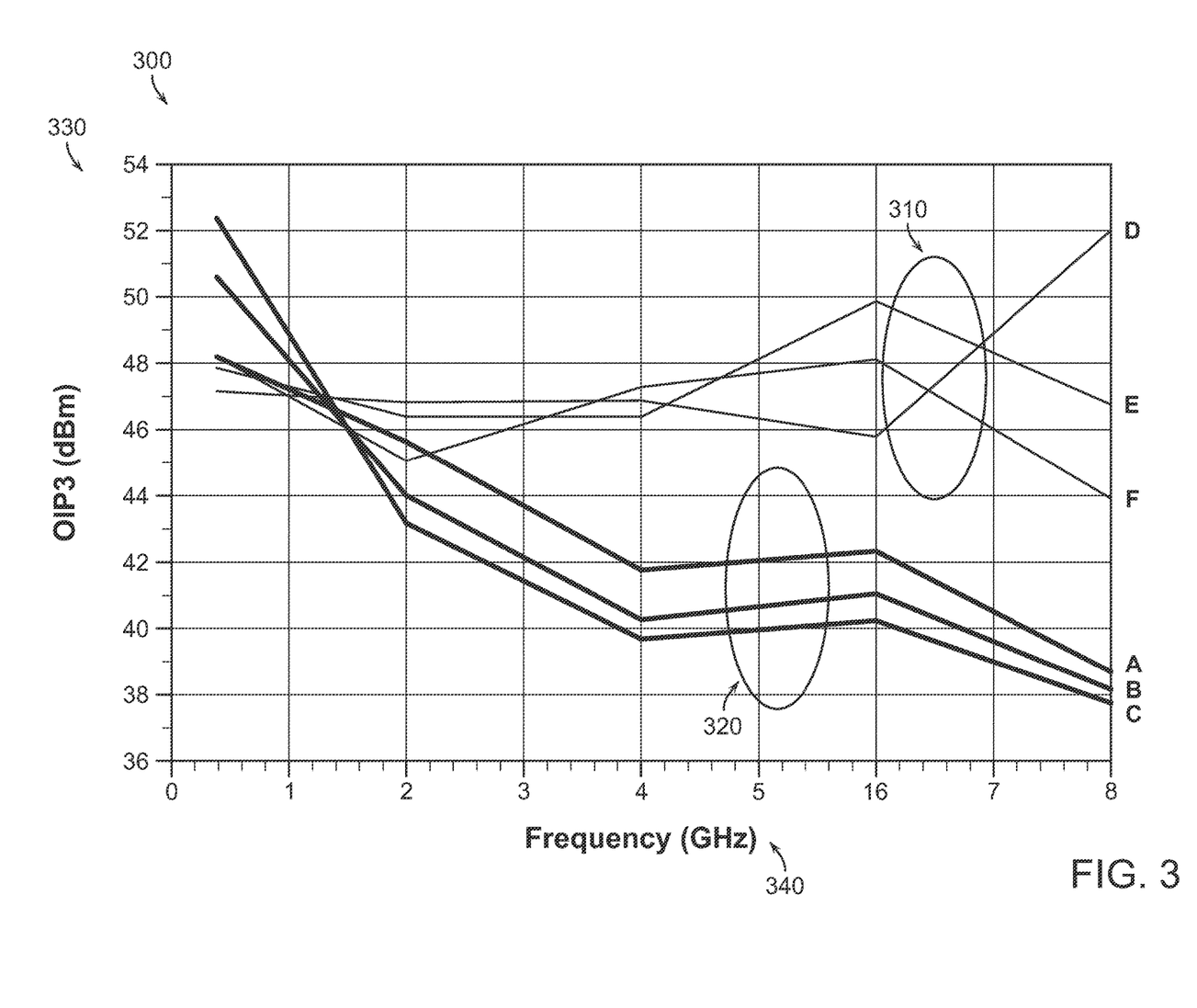
FIG. 3 depicts an exemplary diagram according to embodiments of the present invention.

Distortions that may be reduced and/or cancelled may be determined by an increase in an output third order intercept point (OIP3) of an RF amplifier and/or a one dB compression point (P1 dB) of an RF amplifier. FIG. 3 is a depiction 300 of performance of an exemplary embodiment of the invention, and OIP3 may be shown according to a power level in decibels referenced to a milliwatt (dBm) 330, and may be plotted versus frequency in gigahertz (GHz) 340. An OIP3 of an RF amplifier according to embodiments of the invention 310 that may be quantified, e.g., measured, at one or more input signal levels and/or RF amplifier operating points may be presented, e.g., plotted, on, for example, a graph of OIP3 330 versus excitation frequency 340 of an RF amplifier. An OIP3 may be determined for an RF amplifier configured to operate at one or more P1 dB output power operating configurations 310 and each may be plotted on a graph. For example, a performance of an amplifier with an input power of −20 dBm may be plotted by curve D, a performance of an amplifier with an input power of −10 dBm may be plotted by curve E, and a performance of an amplifier with an input power of −8 dBm may be plotted by curve F.

Such RF amplifier output performance may be compared to an output signal performance 320 of corresponding RF amplifiers that may be operating without a benefit of a modified feedback signal according to embodiments herein. For example, a performance of an amplifier with an input power of −20 dBm may be plotted by curve A, a performance of an amplifier with an input power of −10 dBm may be plotted by curve B, and a performance of an amplifier with an input power of −8 dBm may be plotted by curve C. An increase in OIP3 of typically up to 12 dB for a plurality of RF amplifier configurations may be demonstrated over multiple octaves of frequency bandwidth by using embodiments of the invention described herein. Such significant improvement in output signal linearity may have an increase in improvement at higher frequencies. An output signal non-linearity may be, for example, a third order intermodulation signal that may be derived from products of non-linear signal elements. Such output third order intermodulation signals, signal products, etc., may be difficult to remove and/or reduce from an amplified signal, e.g., post amplification. Application of a subsequent filter that may, for example, be external to an amplifier, in cascade with an amplifier, etc., and that may be added to reduce and/or remove undesired signal products, may have a non-linear passband response, e.g., non-linear amplitude, non-linear phase, or combinations of both, versus frequency, and may create additional distortion of a desired signal that may be in a passband of such filter. A third order intermodulation signal may be quantified by measuring, analyzing, calculating, etc., a third order intercept point.

Figure 4:
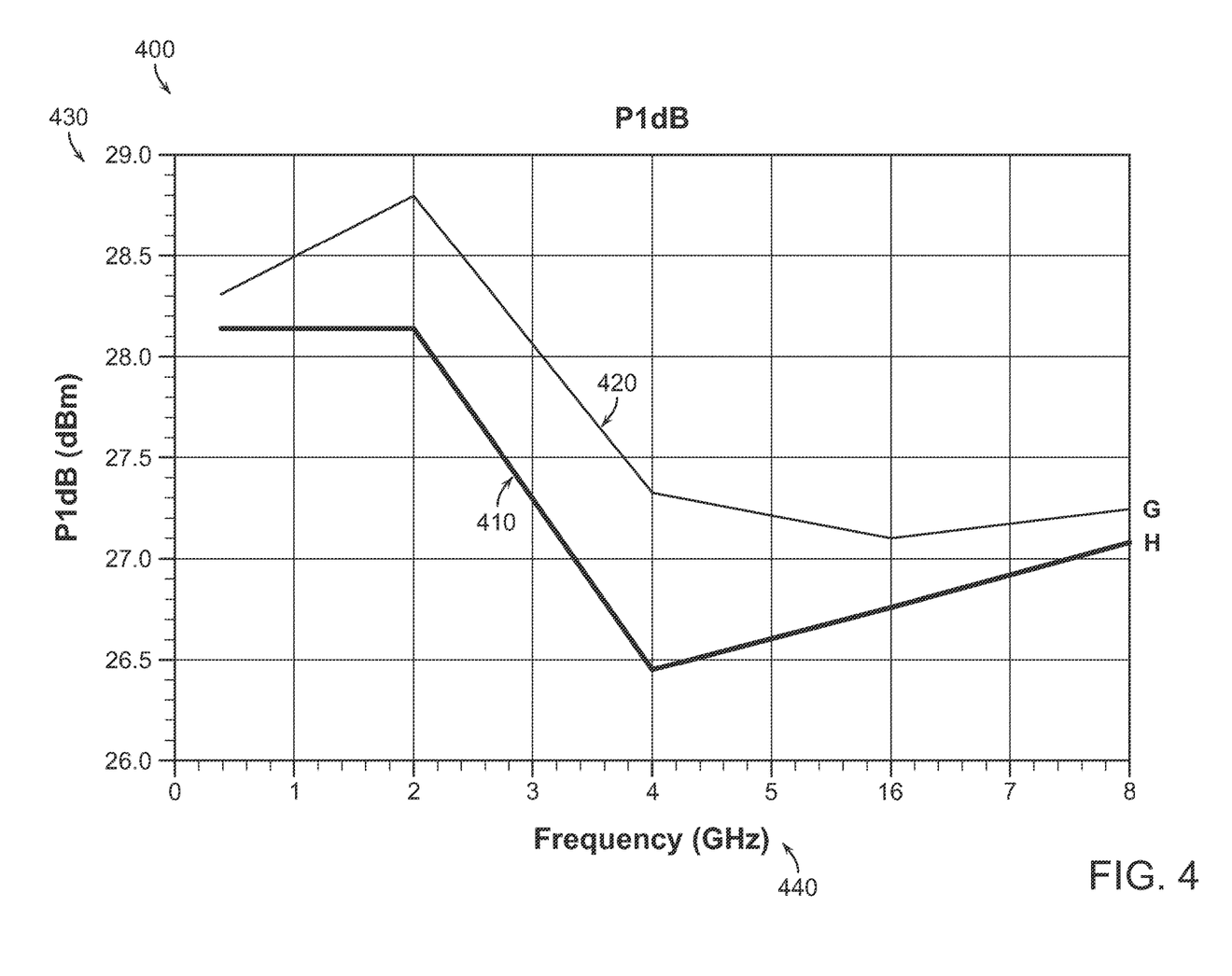
FIG. 4 depicts an exemplary diagram according to embodiments of the present invention.

FIG. 4 is a depiction 400 of performance of an exemplary embodiment of the invention. An output 1-dB compression point (P1 dB) 430 may be plotted versus frequency (GHz) 440. An RF amplifier modified to include a feedback modification network according to embodiments described herein may have an increase in output RF signal linearity 420 as measured by an increase in a P1 dB operating point of such an RF amplifier, and plotted by exemplary curve G. Such performance may be compared to a same RF amplifier without benefit of such embodiments 410, and plotted by exemplary curve H. An increase in P1 dB of typically 0.5 to 1.0 dB may be achieved over at least a multi-octave frequency bandwidth.

Figure 5:
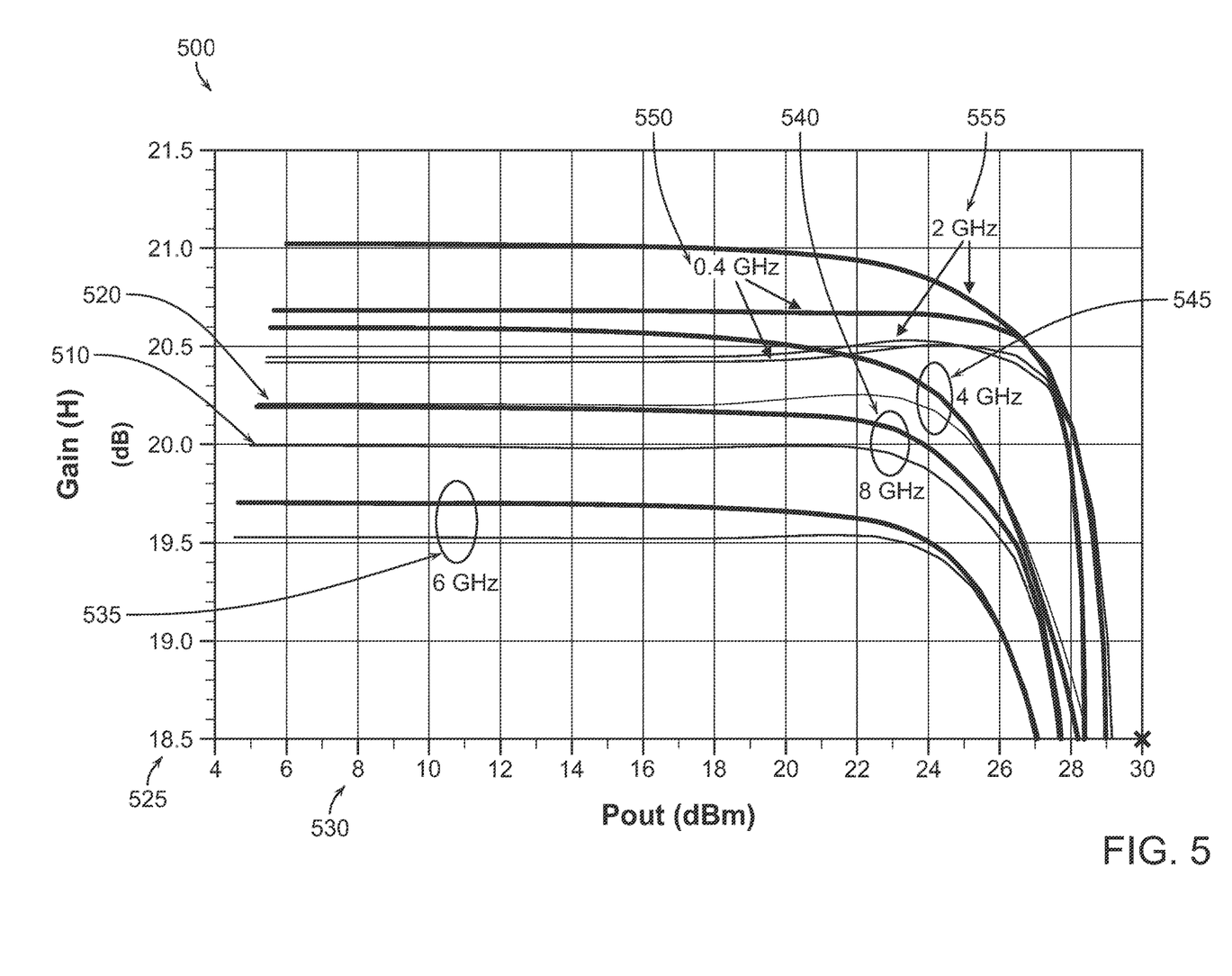
FIG. 5 depicts an exemplary diagram according to embodiments of the present invention.

FIG. 5 is a depiction 500 of performance of an exemplary embodiment of the invention. Gain (dB) 525 of an amplifier may be plotted versus output power (Pout) in dBm 530. For example, at 8 GHz 540, an RF amplifier modified to include a feedback modification network according to embodiments described herein may have an increase in a gain flatness of an RF signal 510 versus an RF amplifier output power, compared to a same RF amplifier without benefit of such embodiments 520. An increase in gain flatness versus output power of typically several tenths of a dB may be achieved over at least a multi-octave frequency bandwidth. In some embodiments, there may be a small reduction in overall gain, and gain flatness will be maintained, thus not adding any additional distortion to any applied RF signal. Other exemplary performance may be plotted for comparison. For example, at 6 GHz 535, an RF amplifier modified to include a feedback modification network according to embodiments described herein may have an increase in a gain flatness of an RF signal versus an RF amplifier output power, compared to a same RF amplifier without benefit of such embodiments. For example, at 4 GHz 545, an RF amplifier modified to include a feedback modification network according to embodiments described herein may have an increase in a gain flatness of an RF signal versus an RF amplifier output power, compared to a same RF amplifier without benefit of such embodiments. For example, at 2 GHz 555, an RF amplifier modified to include a feedback modification network according to embodiments described herein may have an increase in a gain flatness of an RF signal versus an RF amplifier output power, compared to a same RF amplifier without benefit of such embodiments. For example, at 0.4 GHz 550, an RF amplifier modified to include a feedback modification network according to embodiments described herein may have an increase in a gain flatness of an RF signal versus an RF amplifier output power, compared to a same RF amplifier without benefit of such embodiments.

Figure 6:
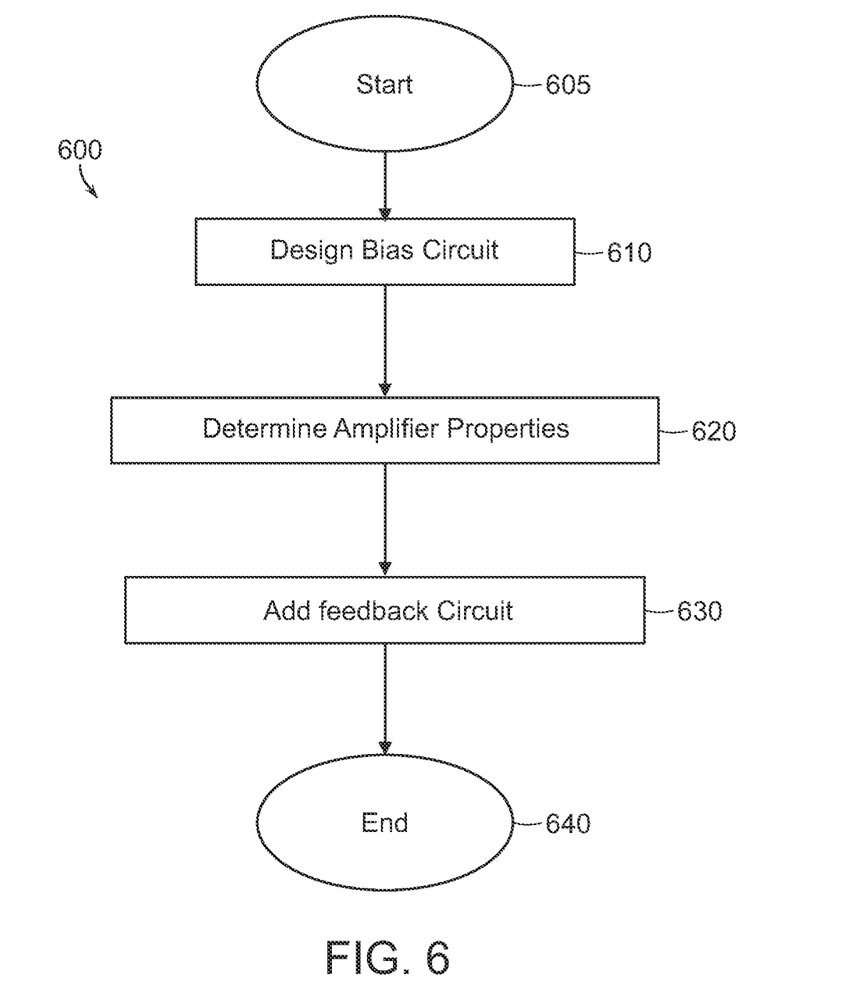
FIG. 6 depicts an exemplary diagram according to embodiments of the present invention.

FIG. 6 is an exemplary method 600 according to embodiments of the invention. An exemplary method may start 605, and a bias circuit, e.g. a current mirror, may be designed 610 and may be operable to provide a drive signal and/or supply to an RF amplifier. Properties of such an RF amplifier may be determined 620, where such properties may include gain performance, non-linearities that may be generated, e.g., higher order non-linearities, output power, e.g., RF power, performance and/or output third order intercept point. Other properties may additionally be determined and may be included in consideration for selecting values according to embodiments herein. A feedback circuit may be added 630 to a bias circuit for an RF amplifier according to embodiments of the invention. A topology and/or connections of a feedback network may be according to embodiments of the invention herein. Values of components that may be included in a feedback network may be selected according to embodiments of the invention described herein, and may be selected to reduce and/or eliminate non-linear components that may be output from an RF amplifier. After inclusion of all feedback, bias and/or bypass components, or elements, a method may end 640.

Figure 7:
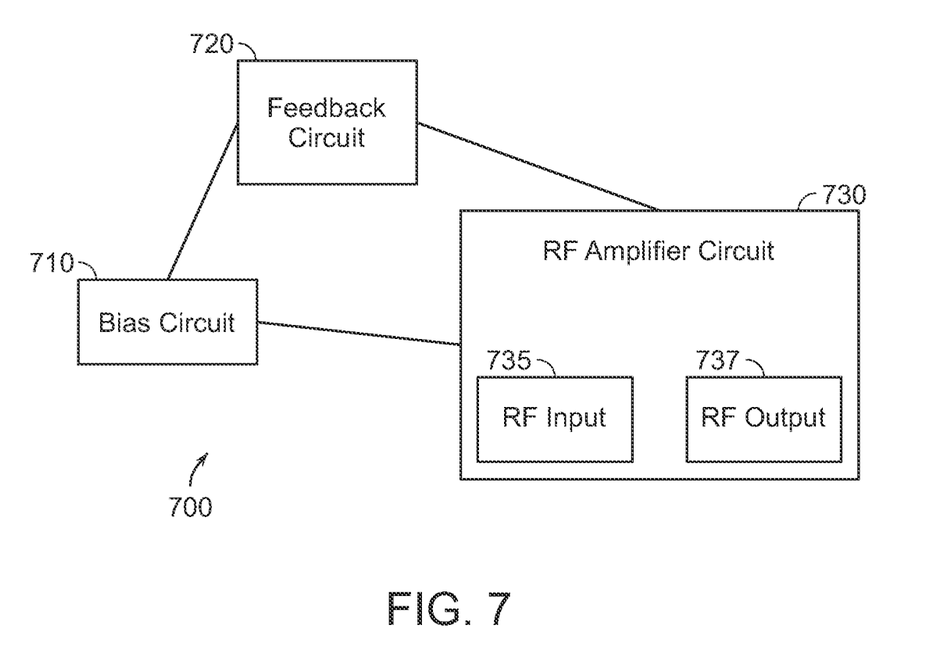
FIG. 7 depicts an exemplary diagram according to embodiments of the present invention.

FIG. 7 is an exemplary block diagram 700 according to embodiments of the invention. An RF amplifier circuit 730 may comprise an RF signal input 735 and an RF signal output 737, and may be driven by a bias circuit 710. Such a bias circuit 710 may be a current mirror circuit. A feedback circuit 720 may sample an output signal of RF amplifier 730 and feed a modified version, according to embodiments of the invention, of such sampled signal into bias network 710. Bias circuit 710 may operate by being modulated by such a feedback signal and may provide a combined drive signal and modulated signal to RF amplifier 730. RF amplifier 730 may operate using such combined modulated drive signal according to embodiments of the invention, and may produce a linearized signal output.

In some embodiments a bias circuit 710 may be, for example, a bias network and may be a current mirror. In other embodiments any suitable current source and/or drive electrical network may supply a modulated drive signal to an RF amplifier according to methods herein. A bias network may be self-stabilized, may be externally stabilized and/or may be dynamic, and may operate according to supply requirements and/or needs of an electrically operably connected RF amplifier and/or amplifier circuit. A bias network according to embodiments of the invention may be used to drive and/or linearize other types of RF and/or microwave circuits that may require an external power supply.

In some embodiments an electrical impedance may be an electrical signal resistance of alternating current (AC) signals and their associated electrical signal energies transitioning an electrical conductor. Electrical impedance across a transition among electrical conductors, electrical devices, electrical circuits and/or combinations of the like, is constant when the electrical impedance of each conductor, device, circuit and/or combination is substantially the same. When an electrical impedance differs, a mismatch is created. Such a mismatch may have a characteristic of an increase in reflected electrical energy. Such a mismatch may be characterized by a reduction in electrical energy being delivered into or out of a conductor, device, circuit and/or combination. Electrical impedance may vary with varying frequencies of AC signals, and may be considered to be frequency dependent.

Some embodiments of the invention may be an apparatus comprised of circuit elements. Such embodiments may comprise at least a first bias transistor and a second bias transistor that may be connected together and may form a current mirror circuit configuration. A first bias resistor may be connected to a first bias transistor and to a second bias transistor, and such first bias resistor may be selected, for example, to set a quiescent current of first and second bias transistors. A radio frequency amplifier transistor may be connected to be powered from a current mirror circuit. A first bypass capacitor may be connected to first and second bias transistors, and may be selected to provide a bypass signal path to ground, for example, for radio frequency signals that may be output from an amplifier transistor, and may be entering into a current mirror circuit. A second bias resistor may be connected in series with a first bypass capacitor, and may be selected to control an amount of radio frequency signals travelling along a bypass signal path to ground. A third bias resistor and a second bypass capacitor may each be connected together and also may be connected in series with each other, and may form a circuit network, for example an injector feedback circuit. An injector feedback circuit may be connected in parallel to a first bias resistor, and a third bias resistor and a second bypass capacitor may each be selected, for example, to control an amount of a sample of radio frequency signals that may be output from a radio frequency amplifier transistor, and may be injected by an injector feedback circuit into a current mirror circuit. A fourth bias resistor may be connected from a current mirror circuit to an input of a radio frequency amplifier transistor, and may be selected, for example, to control a bias input to a radio frequency amplifier transistor, and may be further selected to control an amount of a sample of radio frequency signals that may be injected into a current mirror circuit and subsequently returned into a radio frequency amplifier transistor, and may be to cancel distortion of a radio frequency amplifier transistor.

Some embodiments of the invention may be where a feedback signal may be predetermined to be an inverse of non-linearities of a signal output from a radio frequency amplifier transistor. A radio frequency amplifier transistor may be comprised of one or more radio frequency amplifier transistors, and may form a radio frequency amplifier circuit. A radio frequency amplifier circuit may operate throughout at least an octave of frequency in the microwave frequency spectrum. Such an amplifier circuit may operate throughout at least a decade of frequency in the microwave frequency spectrum. A radio frequency amplifier transistor may be one or more field effect transistors (FET). A first bias transistor and a said second bias transistor may each be one or more field effect transistors (FET). A third bias resistor and a second bypass capacitor may be further comprised of one or more resistors and one or more capacitors, and may be configured to form a combined circuit network, for example in combination.

Some embodiments of the invention may be where a first bias resistor may provide feedback of a sample of radio frequency signals output from a radio frequency amplifier transistor that may be injected into a current mirror circuit. Such feedback from such first bias resistor may be sufficient to provide a sample of radio frequency signals that may be injected into a current mirror circuit and then subsequently may be returned into a radio frequency amplifier transistor, and may cancel some or all distortion of such a radio frequency amplifier transistor, and may perform without any additional contributions of an injector feedback circuit. In some embodiments, an injector feedback circuit may be absent from an embodiment, and feedback from only such a first bias resistor may provide all feedback for such embodiment to perform according to desired performance of the invention.

Some embodiments of the invention may be where an apparatus may perform dynamically and independent of additional control inputs. Distortion of one or more radio frequency amplifier transistors may be derived from a semiconductor process that may be used to create one or more radio frequency amplifier transistor. Distortion of a radio frequency amplifier transistor may be small signal intermodulation distortion, and such small signal intermodulation distortion may be capable of measurement by one or more output third order intermodulation parameters. Distortion of a radio frequency amplifier transistor may be large signal modulation distortion, and such large signal modulation distortion may be capable of measurement by one or more adjacent channel leakage ratio parameters and/or one or more error vector magnitude parameters.

Some embodiments of the invention may be an apparatus for amplifier bias. Such an apparatus may comprise a first transistor and a second transistor that may be operably connected together, for example, in a current minor configuration, and may have a first common connection node and a second common connection node. A second transistor may be configured to supply electrical current to an electrical signal amplifier from a second common connection node. A first resistor may be operably connected to a first transistor at a first common connection node and to a second transistor at a second common connection node, and a first resistor may provide an electrical bias signal among a first transistor and a second transistor. A first capacitor may be connected between a circuit signal ground and a second resistor. A second resistor may be connected between a first capacitor and a first common connection node, and/or one or more first capacitors and/or one or more second resistors together may form a complex electrical impedance that may control, for example, an amount of electrical signal that may be fed back from an electrical signal amplifier to a current mirror, and may be removed from injection into a first transistor and/or a second transistor. A second capacitor may be connected between a second common connection node and a third resistor, and such a third resistor may be connected between a second capacitor and a first common connection node. A third resistor and/or a second capacitor together may form, for example, a complex electrical impedance that may provide a feedback signal from a second common connection point to a first common connection point. A feedback signal may be derived, for example, from an output of an electrical signal amplifier, and may modulate an output of a first transistor and/or a second transistor. A fourth resistor may be connected between a third common connection point of a first transistor and a second transistor, and may provide a bias input to an electrical signal amplifier. Such a fourth resistor may additionally provide a modulated output to an input of an electrical signal amplifier. Further, a modulated signal input to an electrical signal amplifier may be an inverse of non-linearities of a signal output from an electrical signal amplifier, and may cancel distortion of such an electrical signal amplifier.

Some embodiments of the invention may be where a first transistor and a second transistor that may each be field effect transistors (FET). An electrical signal amplifier may be comprised of one or more field effect transistors (FET).

Some embodiments of the invention may be where distortion may be comprised of one or more of small signal intermodulation distortion, for example, of an amplifier output third order intercept parameter, for example, large signal adjacent channel leakage ratio distortion of an amplifier parameter, and/or, for example, large signal error vector magnitude of an amplifier parameter.

An embodiment of the invention may be a method that may comprising designing a bias circuit that may provide power to a radio frequency amplifier circuit, and such a bias circuit may be a current mirror. Properties of a radio frequency amplifier circuit may be determined, or predetermined, and such properties may include one or more non-linear signal components of an output signal of a radio frequency amplifier circuit. A feedback circuit may be added to a bias circuit, and such a feedback circuit may include at least one real impedance component and/or at least one reactive impedance component, and may have, for example, selective feedback performance versus frequency, for example, where a feedback circuit may provide a modulating signal, and may include signal components, for example, selected to be inverse to amplifier non-linear signal components. Such bias circuit may be injected into a radio frequency amplifier, and such injection may perform distortion cancellation of non-linear signal components, and may produce a linearized output signal along with an amplified output signal.

Some embodiments of the invention may be where a distortion may be comprised of one or more small signal intermodulation distortions, for example, of an amplifier output third order intercept parameter, large signal adjacent channel leakage ratio distortion of an amplifier parameter, or large signal error vector magnitude of an amplifier parameter. A bias circuit and a radio frequency amplifier circuit may be comprised of field effect transistors (FET). A radio frequency amplifier circuit may operate throughout at least an octave of frequency in the microwave frequency spectrum, and may operate throughout at least a decade of frequency in the microwave frequency spectrum While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus comprising:
    a first bias transistor and a second bias transistor connected together to form a current mirror circuit configuration;
    a first bias resistor connected to said first bias transistor and said second bias transistor, and said first bias resistor selected to set a quiescent current of said first and second bias transistors;
    a radio frequency amplifier transistor connected to be powered from said current mirror circuit;
    a first bypass capacitor connected to said first and second bias transistors, and selected to provide a bypass signal path to ground for radio frequency signals output from said amplifier transistor entering into said current mirror circuit;
    a second bias resistor connected in series with said first bypass capacitor, and further selected to control the amount of said radio frequency signals travelling along said bypass signal path to ground;
    a third bias resistor and a second bypass capacitor connected together and in series to form an injector feedback circuit, said injector feedback circuit connected in parallel to said first bias resistor, wherein said third bias resistor and said second bypass capacitor are each selected to control the amount of a sample of radio frequency signals output from said radio frequency amplifier transistor injected by said injector feedback circuit into said current mirror circuit; and
    a fourth bias resistor connected from said current mirror circuit to the input of said radio frequency amplifier transistor, and selected to control bias input to said radio frequency amplifier transistor and further selected to control the amount of said sample of radio frequency signals injected into said current mirror circuit and subsequently returned into said radio frequency amplifier transistor to cancel distortion of said radio frequency amplifier transistor.

2. The apparatus of claim 1, wherein said feedback signal is predetermined to be an inverse of non-linearities of the signal output from said radio frequency amplifier transistor.

3. The apparatus of claim 1, wherein said radio frequency amplifier transistor is comprised of one or more radio frequency amplifier transistors to form a radio frequency amplifier circuit.

4. The apparatus of claim 3, wherein said radio frequency amplifier circuit operates throughout at least an octave of frequency in the microwave frequency spectrum.

5. The apparatus of claim 1, wherein said radio frequency amplifier transistor is a field effect transistor (FET).

6. The apparatus of claim 1, wherein said first bias transistor and said second bias transistor are each a field effect transistor (FET).

7. The apparatus of claim 1, wherein said third bias resistor and said second bypass capacitor are further comprised of one or more resistors and one or more capacitors, configured to form a combined circuit network.

8. The apparatus of claim 1, wherein said first bias resistor provides feedback of a sample of said radio frequency signals output from said radio frequency amplifier transistor injected into said current mirror circuit, and wherein said feedback from said first bias resistor is sufficient to provide said sample of radio frequency signals injected into said current mirror circuit and subsequently returned into said radio frequency amplifier transistor to cancel distortion of said radio frequency amplifier transistor, without additional contributions of said injector feedback circuit.

9. The apparatus of claim 1, wherein said apparatus performs dynamically and independent of additional control inputs.

10. The apparatus of claim 1, wherein said distortion of said radio frequency amplifier transistor is derived from the semiconductor process used to create said radio frequency amplifier transistor.

11. The apparatus of claim 1, wherein said distortion of said radio frequency amplifier transistor is small signal intermodulation distortion, and said small signal intermodulation distortion is capable of measurement by one or more output third order intermodulation parameters.

12. The apparatus of claim 1, wherein said distortion of said radio frequency amplifier transistor is large signal modulation distortion, and said large signal modulation distortion is capable of measurement by one or more adjacent channel leakage ratio parameters and one or more error vector magnitude parameters.

13. An apparatus for amplifier bias comprising:
    a first transistor and a second transistor operably connected together in a current mirror configuration with a first common connection node and a second common connection node, wherein said second transistor is configured to supply electrical current to an electrical signal amplifier from said second common connection node;
    a first resistor operably connected to said first transistor at the said first common connection node and to said second transistor at said second common connection node, wherein said first resistor provides an electrical bias signal among said first transistor and said second transistor;
    a first capacitor connected between circuit signal ground and a second resistor, said second resistor connected between said first capacitor and said first common connection node, wherein said first capacitor and said second resistor together form a complex electrical impedance controlling an amount of electrical signal fed back from said electrical signal amplifier to said current mirror, to be removed from injection into said first transistor and said second transistor;

a second capacitor connected between said second common connection node and a third resistor, said third resistor connected between said second capacitor and said first common connection node, wherein said third resistor and said second capacitor together form a complex electrical impedance to provide a feedback signal from said second common connection point to said first common connection point, and wherein said feedback signal is derived from the output of said electrical signal amplifier, and modulates the output of said first transistor and said second transistor; and a fourth resistor connected between a third common connection point of said first transistor and said second transistor and providing a bias input to said electrical signal amplifier, wherein said fourth resistor additionally provides said modulated output to the input of said electrical signal amplifier, and further said modulated signal input to said electrical signal amplifier is an inverse of non-linearities of the signal output from said electrical signal amplifier and cancels distortion of said electrical signal amplifier.

14. The apparatus of claim 13, wherein said first transistor and said second transistor are each field effect transistors (FET).

15. The apparatus of claim 13, wherein said electrical signal amplifier is further comprised of one or more field effect transistors (FET).

16. The apparatus of claim 13, wherein said distortion is comprised of one or more of small signal intermodulation distortion of an amplifier output third order intercept parameter, large signal adjacent channel leakage ratio distortion of an amplifier parameter, or large signal error vector magnitude of an amplifier parameter.

17. A method comprising:
designing a bias circuit to provide power to a radio frequency amplifier circuit, wherein said bias circuit is a current mirror;

determining properties of said radio frequency amplifier circuit, wherein said properties include non-linear signal components of the output signal of said radio frequency amplifier circuit; and adding a feedback circuit to said bias circuit, said feedback circuit including at least one real impedance component and at least one reactive impedance component, and having selective feedback performance versus frequency, wherein said feedback circuit provides a modulating signal, including signal components selected to be inverse to said non-linear signal components, to said bias circuit that is injected into said radio frequency amplifier, said injection performing distortion cancellation of said non-linear signal components, producing a linearized and amplified output signal.

18. The method of claim 17, wherein said distortion is comprised of one or more of small signal intermodulation distortion of an amplifier output third order intercept parameter, large signal adjacent channel leakage ratio distortion of an amplifier parameter, or large signal error vector magnitude of an amplifier parameter.

19. The method of claim 17, wherein said bias circuit and said radio frequency amplifier circuit are comprised of field effect transistors (FET).

20. The method of claim 17, wherein said radio frequency amplifier circuit operates throughout at least an octave of frequency in the microwave frequency spectrum.

* * * * *